United States Patent [19]

Furukawa et al.

[11] Patent Number: 6,017,810
[45] Date of Patent: Jan. 25, 2000

[54] PROCESS FOR FABRICATING FIELD EFFECT TRANSISTOR WITH A SELF-ALIGNED GATE TO DEVICE ISOLATION

[75] Inventors: Toshiharu Furukawa, Essex Junction; Mark C. Hakey; Steven J. Holmes, both of Milton; David V. Horak, Essex Junction; Paul A. Rabidoux, Winooski, all of Vt.

[73] Assignee: International Business Machines Corporation, Armonk, N.Y.

[21] Appl. No.: 09/070,633

[22] Filed: Apr. 30, 1998

[51] Int. Cl.[7] .................... H01L 21/3205; H01L 21/4763
[52] U.S. Cl. ...................... 438/592; 438/296; 438/586
[58] Field of Search ................................. 438/592, 586, 438/296, 300

[56] References Cited

U.S. PATENT DOCUMENTS

| | | | |
|---|---|---|---|
| 5,691,215 | 11/1997 | Dai et al. | 437/44 |
| 5,904,531 | 5/1999 | Liaw | 438/296 |
| 5,911,111 | 6/1999 | Bohr et al. | 438/585 |
| 5,940,707 | 8/1999 | Gardner et al. | 438/270 |

Primary Examiner—John F. Niebling
Assistant Examiner—Alexander G. Ghyka
Attorney, Agent, or Firm—Pollock, Vande Sande & Amernick

[57] ABSTRACT

Semiconductor devices are fabricated by providing a substrate having an insulating layer on the substrate, a conductive layer on the insulating layer and isolation regions through the conductive layer into the substrate insulating layer and forming a photo-resist layer on the isolating regions and on the conductive layer, forming an opening through the resist having a preselected shape at least over a portion of the conductive layer, partially etching some of the conductive layer through the opening selectively to the material of the device isolation region; removing the resist layer; depositing a conductive material on the etched conductive layer through the opening; planarizing the isolation regions, the conductive layer and the conductive material; etching the conductive-forming layer and the insulating layer except beneath the conductive material including exposing portions of the substrate for forming source/drain regions in the substrate.

14 Claims, 2 Drawing Sheets

PROCESS FOR FABRICATING FIELD EFFECT TRANSISTOR WITH A SELF-ALIGNED GATE TO DEVICE ISOLATION

TECHNICAL FIELD

The present invention is concerned with a method for fabricating field effect transistors (FETs) with shorter channels along with highly conductive gate. In particular, according to the present invention, a self-aligned gate to active regions is provided. According to the present invention, a technique for creating sublithographic gate structures using a self-trimming process is employed.

BACKGROUND OF THE INVENTION

The FET is an important electrical switching device in very large scale integrated (VLSI) circuits. Such circuits may contain hundreds of millions of FETs on a single semiconductor chip. Such chips typically measure less than 1 cm on a side. The physical size (i.e. the lateral dimensions) of the FET device and the ease of electrically interconnecting a plurality of FETs are important factors in determining how closely devices may be packed into a given chip area. Thus, the degree of integration is in part determined by the device packing density.

The demands for higher performance MOSFET require MOSFETs to have shorter channel lengths for higher current drive. Accordingly, work continues for providing new lithographic procedures for yielding the minimally smallest structure for a given lithographic features size without significantly increasing the complexity of the fabricating process. For instance, very short channel MOSFET devices can be built by using sub-lithographic technique such as phase-edge and hybrid-resist lithography to define a device-gate. Particularly, hybrid-resist lithography is very attractive because of its superior line width control over any other lithographic technique. However, these techniques require trimming of a loop to define a straight device gate. Trimming requires an extra trim mask and trim-etch process and also requires an extra area for trim mask. As the device channel length becomes shorter, the gate width narrows. The narrowing of the gate width, in turn, makes it difficult to process the gate for achieving low resistance such as by salicidation.

SUMMARY OF INVENTION

The present invention describes a method for achieving a low resistive narrow gate.

The present invention provides a process for fabricating high performance and high density devices. The process of the present invention employs self-aligned gate to active device area using an image reversal process. Moreover, the process of the present invention provides a simplified, lower cost method for creating a sublithographic gate conductor structure with self-trimming. According to the present invention, hybrid-resist, phase-edge or other sublithographic or conventional lithographic processes can be employed.

More particularly, the method of the present invention comprises providing a substrate having an insulating layer thereon, a first conductive layer on the insulating layer, and isolation regions through the first conductive layer and insulating layer and into the substrate. Next, a resist layer is formed on the isolation regions and on the first conductive layer. An opening is created through the resist layer having a preselected shape at least over a portion of the first conductive layer and located vertically between the isolation regions formed in the substrate, partially etching some of the first conductive layer through the opening. A conductive material is deposited over the etched first conductive layer after removing the resist layer. The isolation regions, the first conductive layer and the deposited conductive material are planarized, leaving the conductive material only in the opening of the first conductive layer. The conductive layer and the insulating layer except that beneath the conductive material is removed, including exposing portions of the substrate for forming source and drain regions in the substrate.

According to preferred aspects of the present invention, the resist layer is a hybrid resist layer.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

In order to facilitate an understanding of the present invention, reference will be made to the figures which illustrate a diagrammatic representation of the steps of the present invention.

Figure 1:
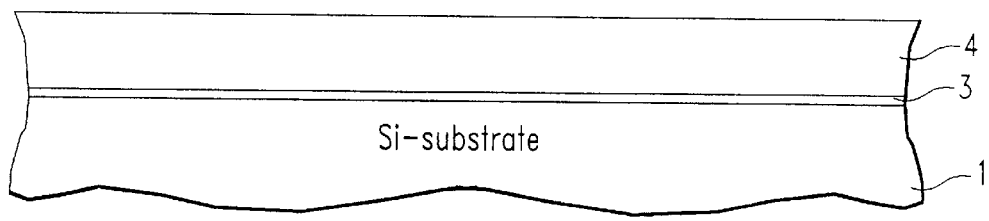
FIGS. 1–4 are schematic diagrams illustrating a device in different steps of the fabrication process of the present invention.

According to the present invention, a semiconductor substrate 1 is provided (see FIG. 1). The semiconductor substrate 1 is typically silicon but can be any semiconductor material such as germanium, silicon-germanium alloy or other compound semiconductor materials.

An insulating layer 3 is formed over the substrate 1. The insulating layer can be provided by thermal oxidation of a silicon substrate or deposition techniques such as chemical vapor deposition (CVD) or physical vapor deposition (PVD). Typically, this layer is about 30 Å to about 100 Å thick and acts as a gate insulator.

A conductive forming material 4 such as a $N^+$ or $P^+$ type doped polycrystalline silicon layer is provided on the insulating layer 3. The conductive layer 4 is to provide the subsequently to be delineated gate conductor. Typically, the conductive layer forming 4 is about 1000 to about 2000 Å thick.

Figure 2:
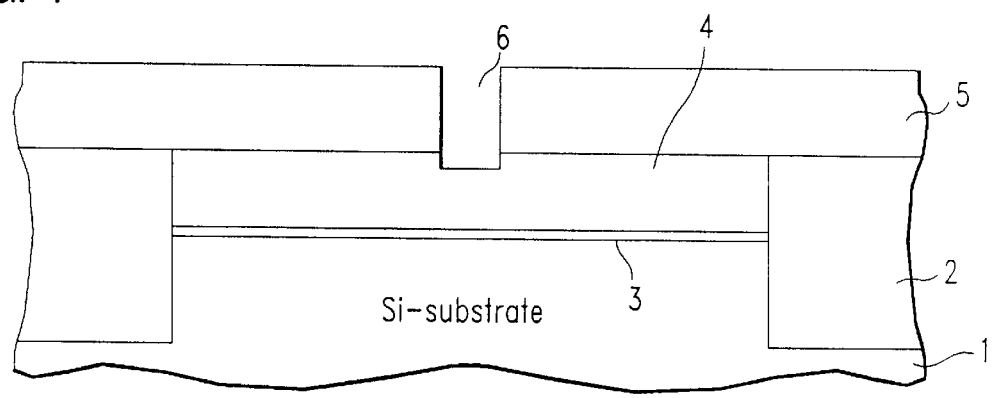

Shallow trench isolation (STI) regions 2 (see FIG. 2) are formed through conductive layer 4, insulating layer 3 and into the substrate 1. This can be referred to as a raised shallow trench technique.

The trench is filled with insulating oxide followed by planarizing the filled oxide to the top surface of the gate conductive layer.

Next, a photoresist layer 5 is formed over the conductive forming insulating layer 4 and the STI region 2. The photoresist can be applied by any convenient technique such as by spinning or spraying the photoresist composition.

According to preferred aspects of the present invention, the photoresist employed is a hybrid resist layer.

Hybrid resists are disclosed in U.S. patent application Ser. No. 08/715,287 filed Sep. 16, 1996 to Hakey et al; Ser. No. 08/715,288 filed Sep. 16, 1996 to Hakey et al; and Ser. No. 08/959,779 BU9-96-099) filed Oct. 29, 1997 entitled "Method for Forming Features Using Frequency Doubling Hybrid Resist and Device Formed Thereby" to Furukawa et al, all of which are assigned to International Business Machines Corporation, the assignee of this application, and are all incorporated herein by reference.

A hybrid photoresist refers to a photoresist material having, simultaneously, both a positive tone and a negative tone response to exposure.

As a hybrid resist is exposed with actinic radiation, areas exposed with high intensity radiation form a negative tone line image. Areas which are unexposed remain insoluble in developer, thus forming a positive tone line pattern. Areas which are exposed with intermediate amounts of intensity, such as the edges of the aerial image where diffraction effects have reduced the intensity, form a space in the resist film during development. This resist response is an expression of the unique dissolution rate properties of a hybrid resist, in which unexposed resist does not develop, partially exposed resist develops at a high rate, and highly exposed resist does not develop.

The unique dissolution rate response of the hybrid photoresist allows a single aerial image to be printed as a space/line/space combination rather than as a single line or space, as with conventional resist. This "frequency doubling" capability of this resist allows conventional expose systems to be extended to higher pattern densities. For example, lines and spaces of 0.2 µm and less can be printed with deep ultraviolet (DUV) lithography tools that are designed for operation at 0.35 µm resolution.

The frequency doubling hybrid resist is typically formulated using components of existing positive and negative tone resists. This includes, for example, poly (hydroxystyrene) resins which are partially modified with acid-sensitive solubility dissolution inhibiting functionalities, a cross-linker, a photo-acid generator, and, optionally, a base additive and a photosensitizer.

The photoresist resins suitable for use in a hybrid resist include any of the base-soluble, long chain polymers suitable for use as a polymer resin in a photoresist formulation. Specific examples include: (i) aromatic polymers having a—OH group, e.g. polyhydroxystyrenes such as poly (4-hydroxystyrene), poly (3-hydroxystyrene), commercially available from Hoechst Celanese of Corpus Christi, Tex., novolak resins commercially available from Shipley of Marlboro, Mass., and polymers having a phenolic—OH group, e.g. phenol formaldehyde resins; (ii) polymers having an acid group, e.g. polymethacrylic acid with an ester side chain; and (iii) acrylamide group type polymers.

Crosslinking compositions are typically tetramethoxymethyl glycouril ("Powderlink") and 2,6-bis(hydroxymethyl)-p-cresol. However, other possible crosslinking compositions include:

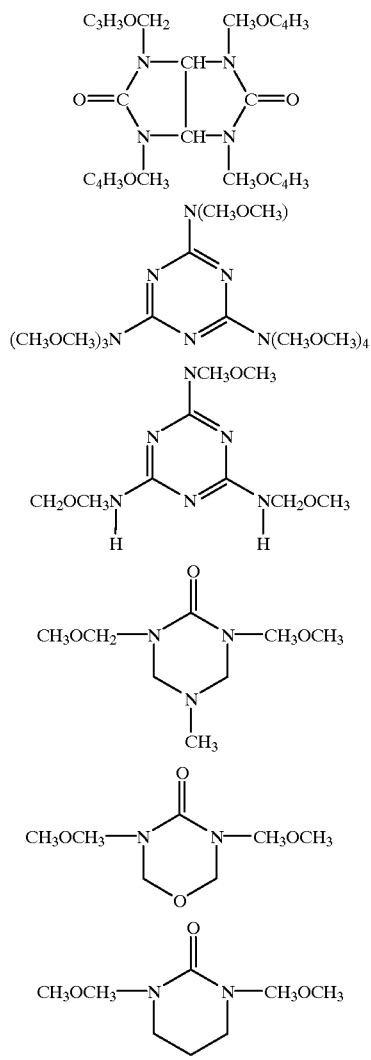

their analogs and derivatives, as can be found in Japanese Laid-Open Patent Application (Kokai) 1-293339, as well as etherified amino resins, for example methylated or butylated melamine resins (N-methoxymethyl- or N-butoxymethyl-melamine respectively) or methylated/butylated glycolurils, for example of the formula:

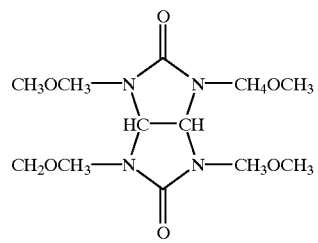

as can be found in Canadian Patent No. 1,204,547.

Photoacid generators ("PAG") include, but are not limited to: N-(trifluoromethylsulfonyloxy)-bicyclo[2.2.1]hept-5-ene-2,3-dicarboximide ("MDT"), onium salts, aromatic diazonium salts, sulfonium salts, diaryliaodonium salts and sulfonic acid esters of N-hydroxyamides or -imides, as disclosed in U.S. Pat. No. 4,731,605, incorporated herein by reference. Also, a PAG that produces a weaker acid such as dodecane sulfonate of N-hydroxynaphthalimide ("DDSN") may be used.

Possible base additives include, but are not limited to: dimethylamino pyridine, 7-diethylamino-4-methyl coumarin ("Coumarin 1"), tertiary amines, proton sponge, berberine, and the polymeric amines as in the "Pluronic" or "Tetronic" series from BASF. Additionally, tetra alkyl ammonium hydroxides or cetyltrimethyl ammonium hydroxide, may be used when the PAG is an onium salt.

Examples of sensitizers that may be utilized include: chrysenes, pyrenes, fluoranthenes, anthrones, benzophenones, thioxanthones, and anthracenes, such as 9-anthracene methanol (9-AM). Additional anthracene derivative sensitizers are disclosed in U.S. Pat. No. 4,371,605, which is incorporated herein by reference. The sensitizer may include oxygen or sulfur. Typically, the sensitizers will be nitrogen free, because the presence of nitrogen, e.g. an amine of phenothiazine group, tends to sequester the free acid generated during the exposure process and the formulation will lose photosensitivity.

The casting solvent is used to provide proper consistency to the entire composition so that it may be applied to the substrate surface without the layer being too thick or too thin. Sample casting solvents include: ethoxyethylpropionate ("EEP"), a combination of EEP and γ-butyrolactone ("GBL"), and propylene-glycolmonoethylether acetate (PM acetate).

The resist is exposed to actinic light such as UV or X-ray radiation, or electron beam using a predetermined lithographic mask pattern, and in the case of a positive resist, the exposed regions of the resist are developed by dissolution in a solvent and in the case of a negative tone resist, the unexposed regions are developed by dissolution in an aqueous base. Also, if desired, instead of using a hybrid resist, phase shift lithography can be employed.

According to the present invention, the hybrid resist, when employed, can be used to create sub-lithographic spaces in resist, which are used to define a gate conductor feature. The hybrid resist space is sub-lithographic in the sense that it represents a single edge from the aerial image created by the exposure tool, whereas a standard positive or negative tone resist prints the entire aerial image as a space or a line. With the hybrid resist, two spaces are created for each individual space or line on the reticle. These sub-lithographic hybrid patterns are desirable for definition of a gate conductor feature because they possess both high resolution and superior image size uniformity. These attributes are a consequence of the fact that only the edge of an aerial image is used to form the space. The edge of the aerial image is high resolution, and, in general, it does not vary significantly as the expose dose or the reticle feature size is altered. For conventional resists, the image size varies with expose dose and reticle dimension, which creates more image variation for the feature drawn on the wafer substrate.

Phase edge lithography creates a similar pattern, as it creates a very sharply defined dark area at the edge of each reticle interface between 0 and 180° degree phase shift regions, for example. One might use phase shift as an alternative method to hybrid resist in forming the gate conductor features described in this invention. The size of the phase edge resist pattern is generally independent of expose dose and the size of the phase shift regions on the reticle. The phase edge resist dimension is essentially a function of the numerical aperture of the expose tool, the control of the phase shift regions across the reticle, and the expose wavelength. For the hybrid resist, the spacewidth is generally a function of the numerical aperture of the expose tool, the expose wavelength, and the relative response of the positive and negative chemistry elements of the resist. Development of the photoresist forms an opening having a predetermined shape at least over a portion of conductive forming layer 4 and located vertically between isolation regions 2. This defines the sublithographic spacing.

A relatively shallow groove 6, such as about 150 Å to about 1000 Å, a typical example being about 500 Å, is etched into the conductive forming layer 4. The etching is selective to the oxide located in the shallow isolation trench 2 making groove 6 self-aligned to the isolation trench 2. Typically, the etching is carried out by reactive ion etching (RIE).

Figure 3:
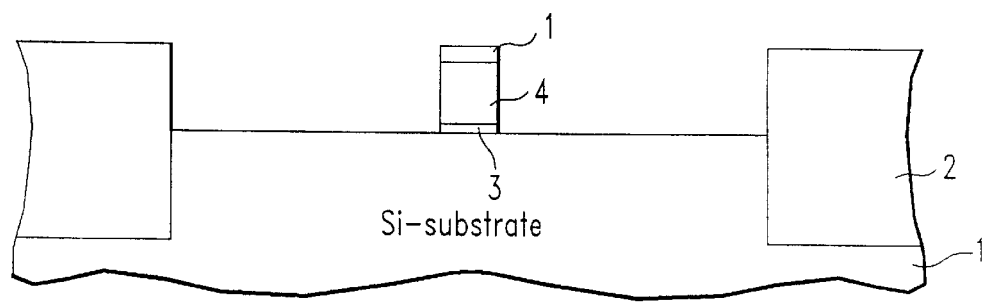
Figure 4:
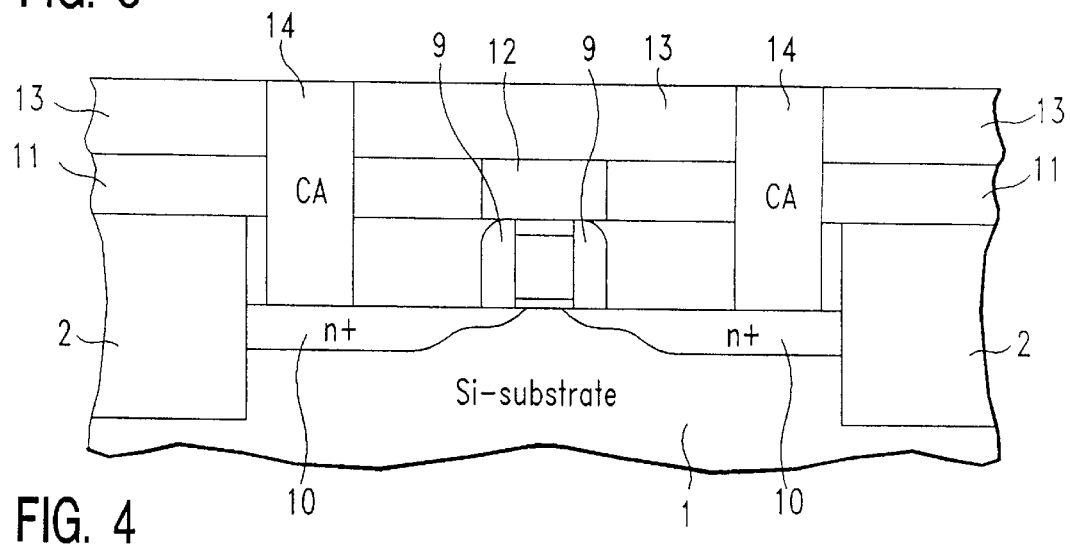
Figure 5:
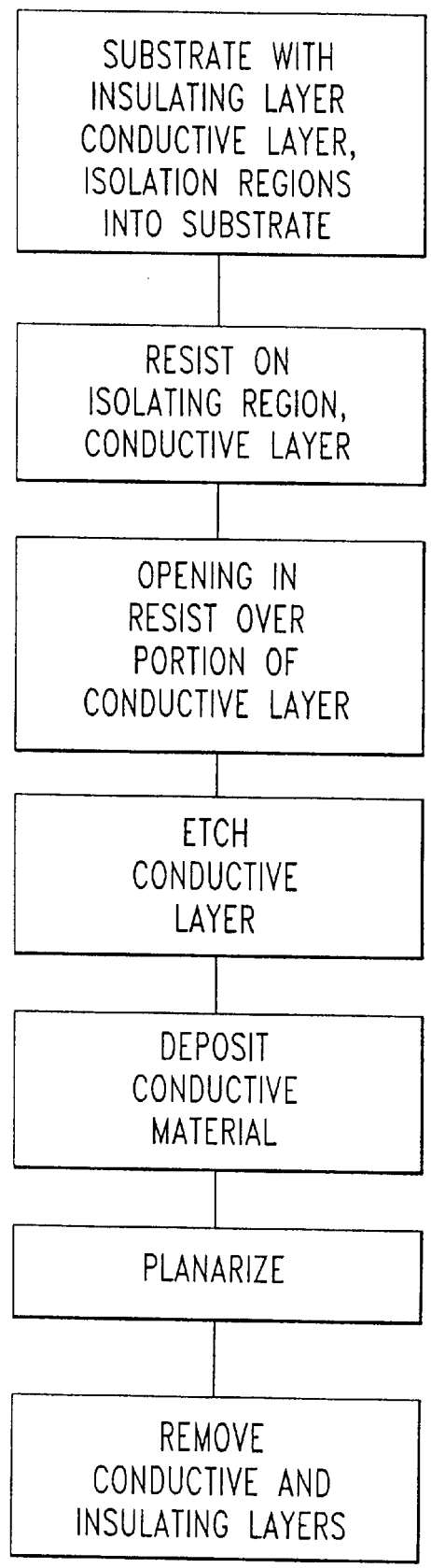
FIG. 5 is a flow diagram of the sequence of fabrication steps employed according to the present invention.

The shallow groove 6 self-aligned to the isolation trench 2 created in conductive layer 4 is filled with a conductive material (see FIG. 3). Examples of suitable conductive material 7 include tungsten, tungsten silicide, titanium silicide, cobalt silicide and titanium nitride. The tungsten or tungsten silicide can be formed by CVD such as by $H_2$ or $SiH_4$ reduction of $WF_6$.

The conductive material 7 is typically deposited to a thickness greater than the depth of the groove 6, such as about 200 Å to about 1200 Å, an example of which is about 700 Å. The conductive material 7 is then planarized to the surface of the conductive layer 4 and the isolation region 2 such as by chemical-mechanical polishing. The conductive layer 4 is patterned by etching using conductive material 7 as the mask resulting in self-aligned device gate to the isolation region. The conductive layer 4 and the insulating layer 3, except from beneath the conductive material 7, are removed including exposing portions of the substrate for forming source/drain regions therein.

Next, source and drain extension implant is provided along with providing oxide or nitride spacers (not shown) along the vertical walls of the gate. Source/drain deep implant is then provided such as by ion with oxide or nitride spacers 9.

A further insulating layer 11 such as silicon dioxide can be deposited such as by CVD, typically providing thicknesses of 1000 Å to about 3000 Å, a particular example being about 2000 Å. The silicon dioxide can be planarized to the surface of the conductive material 7 such as by chemical-mechanical polishing, and another layer of silicon dioxide of thickness about 1000 Å to 3000 Å, a typical example being about 2000 Å, is deposited.

Gate wiring conductor such as W or $WSi_x$ can be formed such as by a damascene process. A further layer of insulator 13 such as silicon dioxide is provided and contacts 14 to diffusion and gate (contacts to gate not shown) can be formed.

Furthermore, for extremely narrow gate dimensions such as less than about 0.2 micron, it may be desirable to dope the conductive gate material such as the polysilicon before etching of the gate material or doping it from the polysilicon gate sidewalls after etching of the gate material to ensure sufficient doping in the polysilicon gate.

According to preferred aspects of the present invention, the gate width is about less than 0.5 microns in length.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for fabricating a semiconductor device which comprises:

prov250ing a semiconductor substrate having an insulating layer on said substrate; conductive-forming layer on said insulating layer and isolation regions through said conductive-forming layer, said insulating layer and into said substrate;

forming a resist layer on said isolating regions and on said conductive-forming layer;

forming an opening through said resist layer having a preselected shape at least over a portion of said conductive-forming layer;

partially etching some of the conductive-forming layer through said opening;

depositing a conductive material on the etched conductive layer through said opening;

planarizing said isolation regions, said conductive-forming layer and said conductive material, including removing said resist layer; and removing said conductive-forming layer and said insulating layer except for those portions located beneath said conductive material, including exposing portions of said substrate for forming source/drain regions in said substrate.

2. The method of claim 1 wherein the step of providing a semiconductor substrate having an insulating layer on said substrate; conductive-forming layer on said insulating layer and isolation regions through said conductive-forming layer; said insulating layer and into said substrate comprises the steps of:

providing a semiconductor substrate;

forming an insulating layer on said substrate;

forming a conductive-forming layer on said insulating layer;

forming isolation regions through said conductive-forming layer, said insulating layer and into said substrate.

3. The method of claim 1 wherein said step of forming the photo-resist layer includes forming a hybrid resist layer on said isolation regions and on the conductive-forming layer.

4. The method of claim 1 further comprising:

forming the source/drain and gate regions in the exposed substrate;

insulating the source/drain regions; and forming contacts to the source/drain regions and to the gate conductive material.

5. The method of claim 1 wherein said conductive-forming layer is doped polycrystalline silicon.

6. The method of claim 1 wherein said conductive material is selected from the group consisting of tungsten, tungsten silicide, titanium silicide, cobalt silicide and titanium nitride.

7. The method of claim 1 wherein said isolation regions are formed shallow trench insulation regions.

8. The method of claim 1 wherein the insulating layer is either thermally grown silicon dioxide or chemical vapor deposited silicon dioxide.

9. The method of claim 8 wherein the thickness of the silicon dioxide is about 30 to about 100 Å.

10. The method of claim 1 wherein forming said opening comprises reactive ion etching.

11. The method of claim 1 which further includes providing gate spacers on the lateral walls of said gate.

12. The method of claim 11 wherein said gate spacers are silicon dioxide or silicon nitride.

13. The method of claim 1 which further includes doping said polysilicon prior to removing portions of it, or after removing portions of it.

14. The method of claim 1 wherein said conductive material is tungsten or tungsten silicide.

* * * * *